(12) United States Patent
Mori et al.

(10) Patent No.: US 10,725,087 B2
(45) Date of Patent: Jul. 28, 2020

(54) SEMICONDUCTOR INTEGRATED DEVICE AND GATE SCREENING TEST METHOD OF THE SAME

(71) Applicant: FUJI ELECTRIC CO., LTD., Kawasaki (JP)

(72) Inventors: Takahiro Mori, Matsumoto (JP); Hitoshi Sumida, Matsumoto (JP); Masahiro Sasaki, Azumino (JP); Akira Nakamori, Matsumoto (JP); Masaru Saito, Matsumoto (JP); Wataru Tomita, Matsumoto (JP); Osamu Sasaki, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 242 days.

(21) Appl. No.: 15/959,786

(22) Filed: Apr. 23, 2018

(65) Prior Publication Data

US 2018/0372791 A1    Dec. 27, 2018

(30) Foreign Application Priority Data

Jun. 23, 2017    (JP) .................................. 2017-123350

(51) Int. Cl.

| | | |
|---|---|---|
| *G01R 31/26* | (2020.01) | |
| *G05F 1/59* | (2006.01) | |
| *H03K 17/687* | (2006.01) | |
| *G01R 31/28* | (2006.01) | |

(52) U.S. Cl.
CPC ........... *G01R 31/2621* (2013.01); *G05F 1/59* (2013.01); *H03K 17/6871* (2013.01); *G01R 31/2884* (2013.01)

(58) Field of Classification Search
CPC ............ G01R 31/2621; G01R 31/2884; G01R 31/2601; G05F 1/59; H03K 17/6871; H01L 21/822; H01L 27/04
See application file for complete search history.

(56) References Cited

U.S. PATENT DOCUMENTS

| | | | | |
|---|---|---|---|---|
| 5,502,399 | A * | 3/1996 | Imai ................... | G01R 31/2884 324/750.3 |
| 2012/0062190 | A1 * | 3/2012 | Haiplik ................. | H02M 3/156 323/271 |
| 2013/0169318 | A1 * | 7/2013 | Li .................... | H03K 19/00361 327/108 |
| 2015/0381148 | A1 * | 12/2015 | Zeng ...................... | H03K 5/08 327/109 |
| 2018/0059166 | A1 * | 3/2018 | Bodano ................. | G01R 31/27 |

FOREIGN PATENT DOCUMENTS

| | | |
|---|---|---|
| JP | 2009-257908 | 11/2009 |
| JP | 2012-42281 | 3/2012 |

* cited by examiner

*Primary Examiner* — Daniel R Miller

(57) ABSTRACT

To provide a semiconductor integrated device capable of a gate screening test with no need for any additional circuit and without adding any gate screening terminal. The semiconductor integrated device includes a gate drive unit configured to drive the gate of a voltage controlled semiconductor element and a regulator configured to supply a gate drive voltage to the gate drive unit. The regulator includes an external connection terminal capable of receiving a gate screening voltage for the voltage controlled semiconductor element in a gate screening test.

20 Claims, 4 Drawing Sheets

SEMICONDUCTOR INTEGRATED DEVICE AND GATE SCREENING TEST METHOD OF THE SAME

CROSS REFERENCE TO RELATED APPLICATIONS AND INCORPORATION BY REFERENCE

This application claims benefit of priority under 35 USC 119 based on Japanese Patent Application No. 2017-123350 filed on Jun. 23, 2017, the entire contents of which are incorporated by reference herein.

TECHNICAL FIELD

The present invention relates to a semiconductor integrated device incorporating a gate screening test function of a drive circuit or the like for an insulated gate device and to a gate screening test method of the semiconductor integrated device.

BACKGROUND ART

A known example of this kind of semiconductor integrated device is a structure disclosed in JP-2012-042281-A.

In a conventional technology disclosed in JP-2012-042281-A, four channels each including a MOSFET (a MOS semiconductor element) and a control circuit therefor are provided on an IC chip, in which voltage level shift circuits are each connected to a gate electrode of each power MOSFET, and each control circuit is connected to each voltage level shift circuit.

The gate electrode of each power MOSFET is connected to a single gate screening test terminal via a reverse current prevention circuit.

SUMMARY OF INVENTION

The conventional technology disclosed in JP-2012-042281-A requires the reverse current prevention circuit between the gate terminal of each power MOSFET that is a gate screening test target and the gate screening test terminal, and also requires each voltage level shift circuit between the control circuit and the gate of each power MOSFET. Due to this, when the number of the power MOSFETs increases, there occurs a problem where chip area increases.

Accordingly, the present invention has been made by focusing attention on the problem of the above conventional technology. It is an object of the invention to provide a semiconductor integrated device configured to enable a gate screening test to be performed with no need for providing any additional circuit and without additionally providing any gate screening terminal and to provide a gate screening test method of the semiconductor integrated device.

In order to achieve the object mentioned above, according to an aspect of the present invention, there is provided a semiconductor integrated device including: a gate drive unit configured to drive a gate of a voltage controlled semiconductor element; and a regulator configured to supply a gate drive voltage to the gate drive unit, wherein the regulator includes an external connection terminal capable of receiving a gate screening voltage for the voltage controlled semiconductor element in a gate screening test.

According to another aspect of the present invention, there is provided a gate screening test method of a semiconductor integrated device including a gate drive unit configured to drive a gate of a voltage controlled semiconductor element and a regulator configured to supply a gate drive voltage to the gate drive unit. The method comprises, while operation of the regulator is stopped, applying a gate screening voltage for the voltage controlled semiconductor element to an external connection terminal of the regulator to perform a gate screening test.

According to the one aspect of the present invention, a gate screening test can be performed by applying a gate screening test voltage to the existing terminal of the regulator in the gate screening test. Thus, it is unnecessary to add any gate screening test circuit, thereby enabling suppression of an increase in chip area.

BRIEF DESCRIPTION OF DRAWINGS

FIGS. 3A and 3B are waveform charts illustrating gate screening test voltages applied to gate screening terminals, in which FIG. 3A illustrates a test voltage for a voltage controlled n-channel semiconductor element, and FIG. 3B illustrates a test voltage for a voltage controlled p-channel semiconductor element.

DETAILED DESCRIPTION

Next, some exemplary embodiments of the present invention will be described with reference to the drawings. In the following description of the drawings, the same or similar parts are denoted by the same or similar reference signs.

Additionally, the following embodiments exemplify devices and methods for embodying a technological concept of the present invention. The technological concept of the invention does not limit materials, shapes, structures, arrangements, and the like of constituent elements to those described below. Various modifications are conceivable according to the technological concept of the invention within the technological scope defined by the claims stated in the scope of claims.

Hereinafter, a semiconductor integrated device according to a first embodiment of the invention will be described with reference to the drawings.

Figure 1:
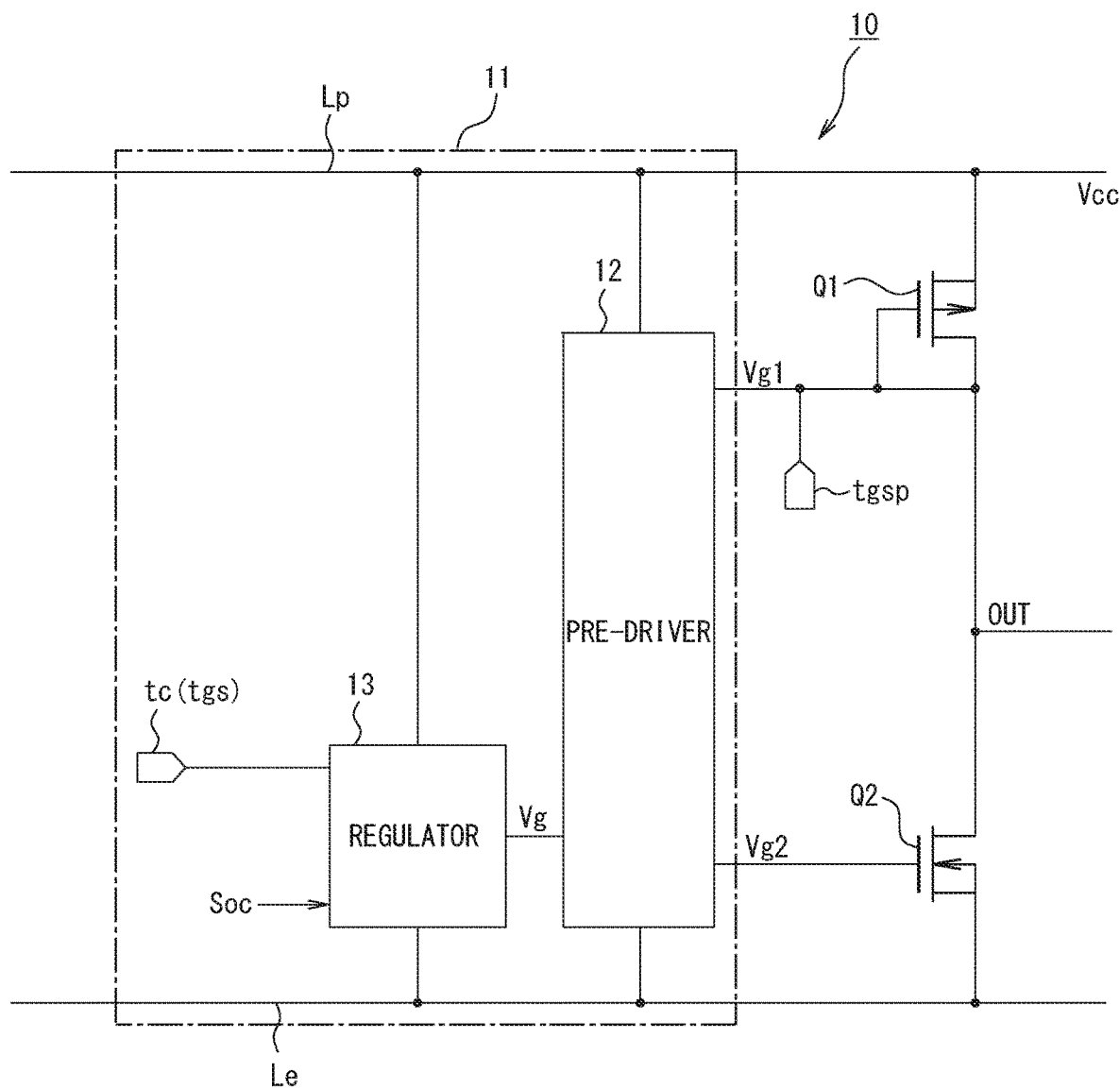
FIG. 1 is a block diagram illustrating a semiconductor integrated device according to a first embodiment of the present invention.

In a semiconductor integrated device 10, as targets to be driven, a voltage controlled p-channel semiconductor element Q1 formed of, for example, a power MOSFET and a voltage controlled n-channel semiconductor element Q2 formed of, for example, similarly, a power MOSFET are connected in series between a DC power supply wire Lp and a ground wire Le, as illustrated in FIG. 1. Output voltage is output from a connection point between the voltage controlled p-channel semiconductor element Q1 and the voltage controlled n-channel semiconductor element Q2. The semiconductor integrated device 10 is provided with a gate screening test function capable of performing a gate screening test, which will be described later, for the voltage controlled p-channel semiconductor element Q1 and the voltage controlled n-channel semiconductor element Q2.

Additionally, the semiconductor integrated device 10 includes a gate drive circuit 11 configured to drive a gate of the voltage controlled p-channel semiconductor element Q1 and a gate of the voltage controlled n-channel semiconductor element Q2. The gate drive circuit 11 includes a pre-driver 12 serving as a gate drive unit configured to supply a gate voltage Vg1 to the gate of the voltage controlled p-channel semiconductor element Q1 and a gate voltage Vg2 to the gate of the voltage controlled n-channel semiconductor element Q2 and a regulator 13 configured to supply a gate drive voltage Vg to the pre-driver 12.

The pre-driver 12 supplies, to the gate of the voltage controlled p-channel semiconductor element Q1, the gate voltage Vg1 that is generated by on-off controlling the gate drive voltage Vg input from the regulator 13 by a gate drive signal input from outside, and also supplies, to the gate of the voltage controlled n-channel semiconductor element Q2, the gate voltage Vg2 that is generated in a similar manner.

The regulator 13 is connected between the DC power supply wire Lp and the ground wire Le, reduces an input DC power supply voltage Vcc to generate the gate drive voltage Vg, and outputs the generated gate drive voltage Vg to the pre-driver 12.

Figure 2:
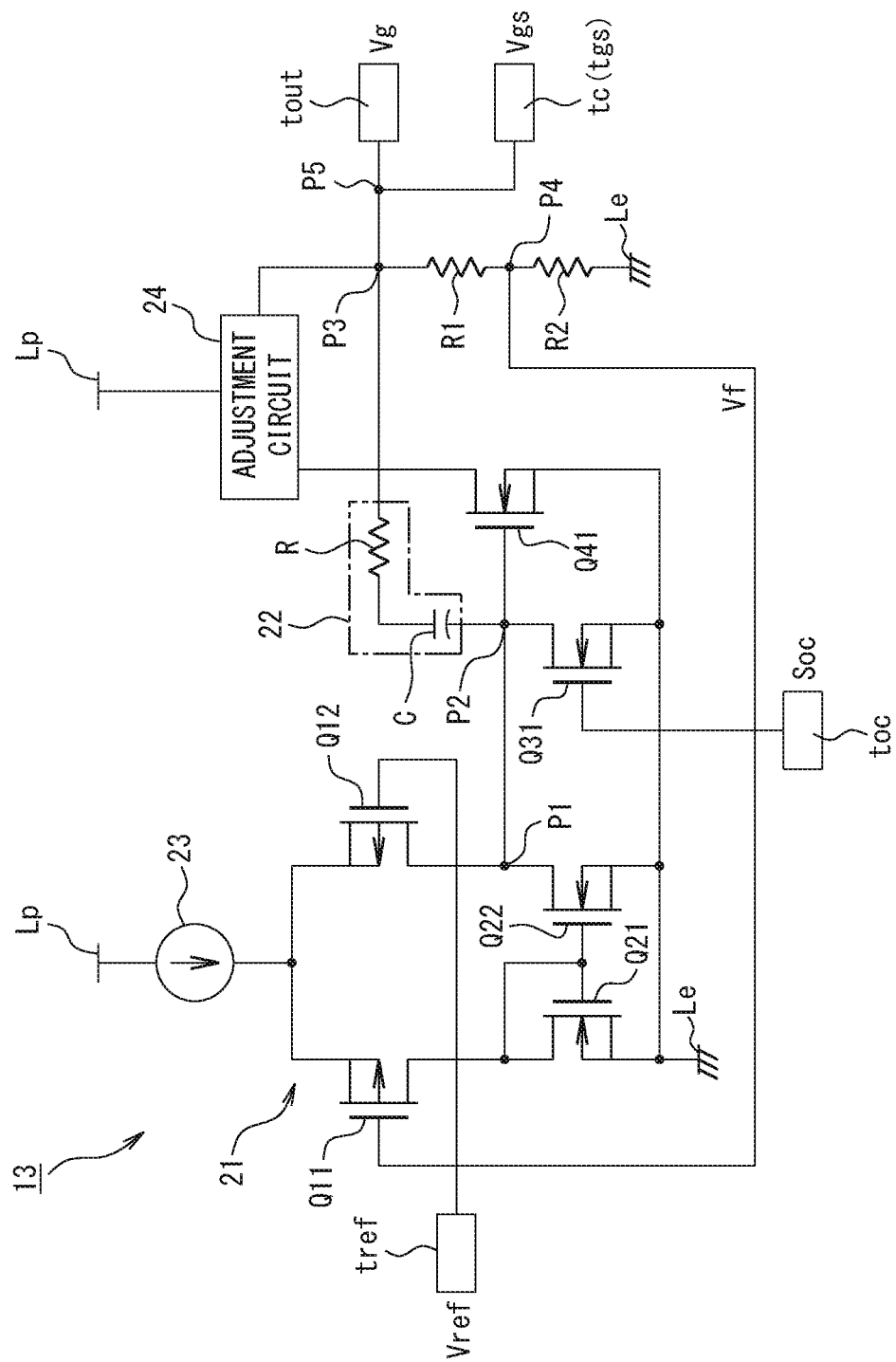
FIG. 2 is a circuit diagram illustrating a specific structure of a regulator of FIG. 1.

A specific structure of the regulator 13 is illustrated in FIG. 2, in which a differential stage 21 and an output side of the differential stage 21 are connected to an output terminal tout via a phase compensation circuit 22. In the differential stage 21, a differential amplifier is formed of a pair of p-channel MOSFETs Q11 and Q12 whose sources are connected to the DC power supply wire Lp via a constant current circuit 23 and two n-channel MOSFETs Q21 and Q22 forming a current mirror circuit and connected between drains of the p-channel MOSFETs Q11 and Q12 and the ground wire Le.

Then, an input terminal tref to which a reference voltage Vref is input is connected to the gate of the p-channel MOSFET Q12 of the differential stage 21. Additionally, a feedback voltage Vf, which will be described later, is input to the gate of the p-channel MOSFET Q11. Furthermore, output voltage output from a connection point P1 between the drain of the p-channel MOSFET Q12 and a drain of the n-channel MOSFET Q22 is output to the output terminal tout via the phase compensation circuit 22. The phase compensation circuit 22 is formed of a series circuit including a capacitor C and a resistor R.

The connection point between the drain of the p-channel MOSFET Q12 and the drain of the n-channel MOSFET Q22 of the differential stage 21 is denoted as P1. Furthermore, a connection point between the phase compensation circuit 22 and an n-channel MOSFET Q31 is denoted as P2. To a gate of the n-channel MOSFET 31 is connected an operation switching terminal toc that receives an operation switching signal Soc from outside.

Furthermore, voltage dividing resistors R1 and R2 are connected in series between a connection point P3 between the phase compensation circuit 22 and the output terminal tout and the ground wire Le. The feedback voltage Vf that is output from a connection point P4 between the voltage dividing resistors R1 and R2 is supplied to the gate of the p-channel MOSFET Q11 of the differential stage 21.

Additionally, the regulator 13 includes an n-channel MOSFET Q41 whose gate is connected to the connection point P2 between the phase compensation circuit 22 and the n-channel MOSFET Q31 and an adjustment circuit 24. The DC power supply voltage Vcc is supplied to the adjustment circuit 24 from the DC power supply wire Lp. One side of the adjustment circuit 24 is connected to a drain of the n-channel MOSFET Q41, and the other side thereof is connected to the connection point P3 between the phase compensation circuit 22 and the output terminal tout. Herein, the adjustment circuit 24 operates to suppress fluctuations such as overshooting that occurs upon start-up of the gate drive voltage Vg output from the output terminal tout.

Furthermore, the regulator 13 includes, at a connection point P5 between the output terminal tout and the connection point P3, a capacitance connection terminal tc serving as an external connection terminal that connects an external capacitance. Under ordinary conditions, an external capacitor for adjusting a delay time or the like is connected to the capacitance connection terminal tc. However, in a gate screening test performed when testing a wafer, the capacitance connection terminal tc is used as agate screening terminal tgs that receives a gate screening voltage Vgs that is higher than an ordinary gate drive voltage Vg.

On the other hand, regarding the p-channel MOSFET Q1, a gate screening terminal (pad) tgsp is connected between the pre-driver 12 and the gate of the p-channel MOSFET Q1, and a ground potential is applied to the gate screening terminal tgsp in a gate screening test for the p-channel MOSFET Q1.

Next, operation of the first embodiment will be described.

First, in the regulator 13, when a high level operation switching signal Soc is input to the operation switching terminal toc from, for example, an external EPROM, the n-channel MOSFET Q31 is turned ON to cause the connection point P1 of the differential stage 21 and the output terminal tout to be connected to the ground wire Le, so that the regulator 13 is caused to go into an operation stop state where the gate drive voltage Vg from the output terminal tout is at a ground level.

From the operation stop state of the regulator 13, the operation switching signal Soc that is input to the operation switching terminal toc is changed to low level, whereby the n-channel MOSFET Q31 is turned OFF to cause an output voltage proportional to a difference between the reference voltage Vref and the feedback voltage Vf to be output from the connection point P1 of the differential stage 21. The output voltage is output to the output terminal tout after being phase-compensated by the phase compensation circuit 22, and supplied as the gate drive voltage Vg from the output terminal tout to the pre-driver 12.

The pre-driver 12 on/off controls the gate drive voltage Vg input from the regulator 13 according to a gate drive signal input from outside, and outputs the gate voltage Vg1 (Vg2) to the p-channel MOSFET Q1 (the n-channel MOSFET Q2). Thus, the p-channel MOSFET Q1 (the n-channel MOSFET Q2) is driven to cause an output signal to be output from the connection point between the p-channel MOSFET Q1 and the n-channel MOSFET Q2.

Figure 3A:
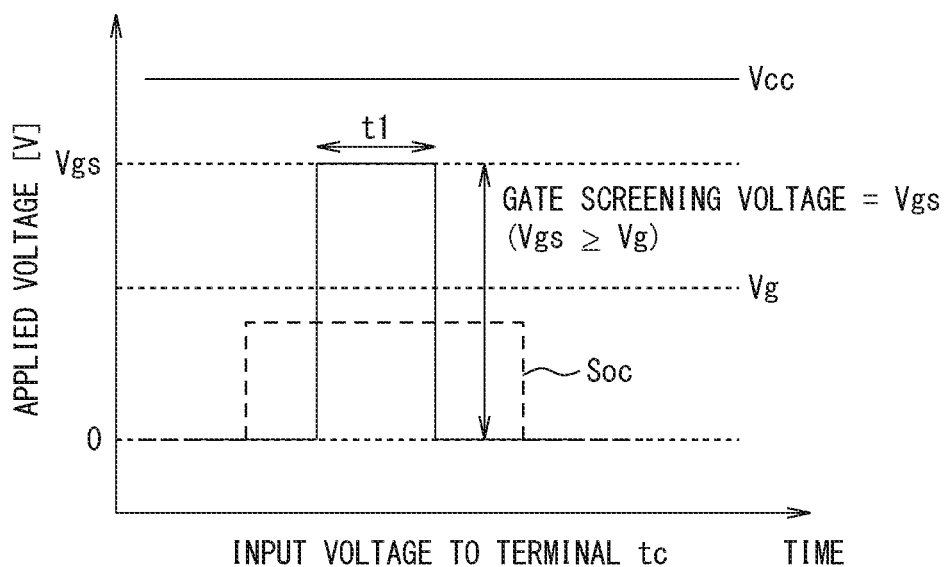

Incidentally, in a process of manufacturing the above-described semiconductor integrated device 10, when performing a gate screening test for the n-channel MOSFET Q2 in a wafer test performed upon completion of manufacturing of the semiconductor integrated device, a high level operation switching signal Soc is input to the operation switching terminal toc of the regulator 13, as illustrated in FIG. 3A. Thus, the n-channel MOSFET Q31 is turned ON to cause the regulator 13 to go into the operation stop state where output of the gate drive voltage Vg is stopped, as described above. In this state, the gate screening test is performed. In the gate screening test, the capacitance connection terminal tc is used as the gate screening terminal tgs, to which the gate screening voltage Vgs that is higher than the ordinary gate drive voltage Vg is applied from the power supply of a wafer tester for a predetermined time t1. At this time, a predetermined gate drive signal is supplied to the pre-driver 12 so that the pre-driver 12 will supply the gate voltage Vg2 to the n-channel MOSFET Q2.

Thus, the gate screening voltage Vgs output from the output terminal tout of the regulator 13 is supplied to the gate of the n-channel MOSFET Q2 through the pre-driver 12, whereby the gate screening test can be performed.

Figure 3B:
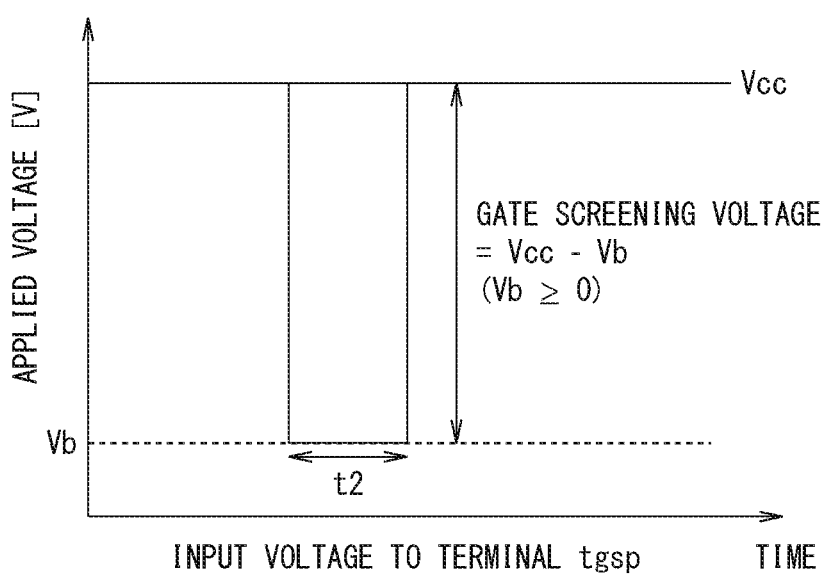

On the other hand, to perform a gate screening test for the p-channel MOSFET Q1, a ground potential Vb is applied to the gate screening terminal tgsp for a predetermined time t2, as illustrated in FIG. 3B. Thus, the gate screening voltage Vgs that is obtained by subtracting the ground potential Vb from the power supply voltage Vcc is applied to the p-channel MOSFET Q1, as illustrated in FIG. 3B. By optionally changing the power supply voltage Vcc, the gate screening test can be performed.

In this manner, in the first embodiment described above, when performing a gate screening test for the n-channel MOSFET Q2, the capacitance connection terminal tc of the regulator 13 is used as the gate screening terminal tgs to which the gate screening voltage Vgs is applied. Thus, it is unnecessary to add a gate screening terminal for the n-channel MOSFET Q2, and there is no increase in the chip area.

In addition, for the p-channel MOSFET Q1, a gate screening test can be performed by providing the gate screening terminal (pad) tgsp between the pre-driver 12 and the gate of the p-channel MOSFET Q1 and applying the ground potential Vb to the gate screening terminal tgsp.

Moreover, unlike the conventional technology, it is unnecessary to provide any voltage level shift circuit or the like, thus enabling suppression of an increase in the chip area.

Next, a second embodiment of the present invention will be described with reference to FIG. 4.

The second embodiment is configured to allow a plurality of n-channel MOSFETs to be driven by a pre-driver.

Figure 4:
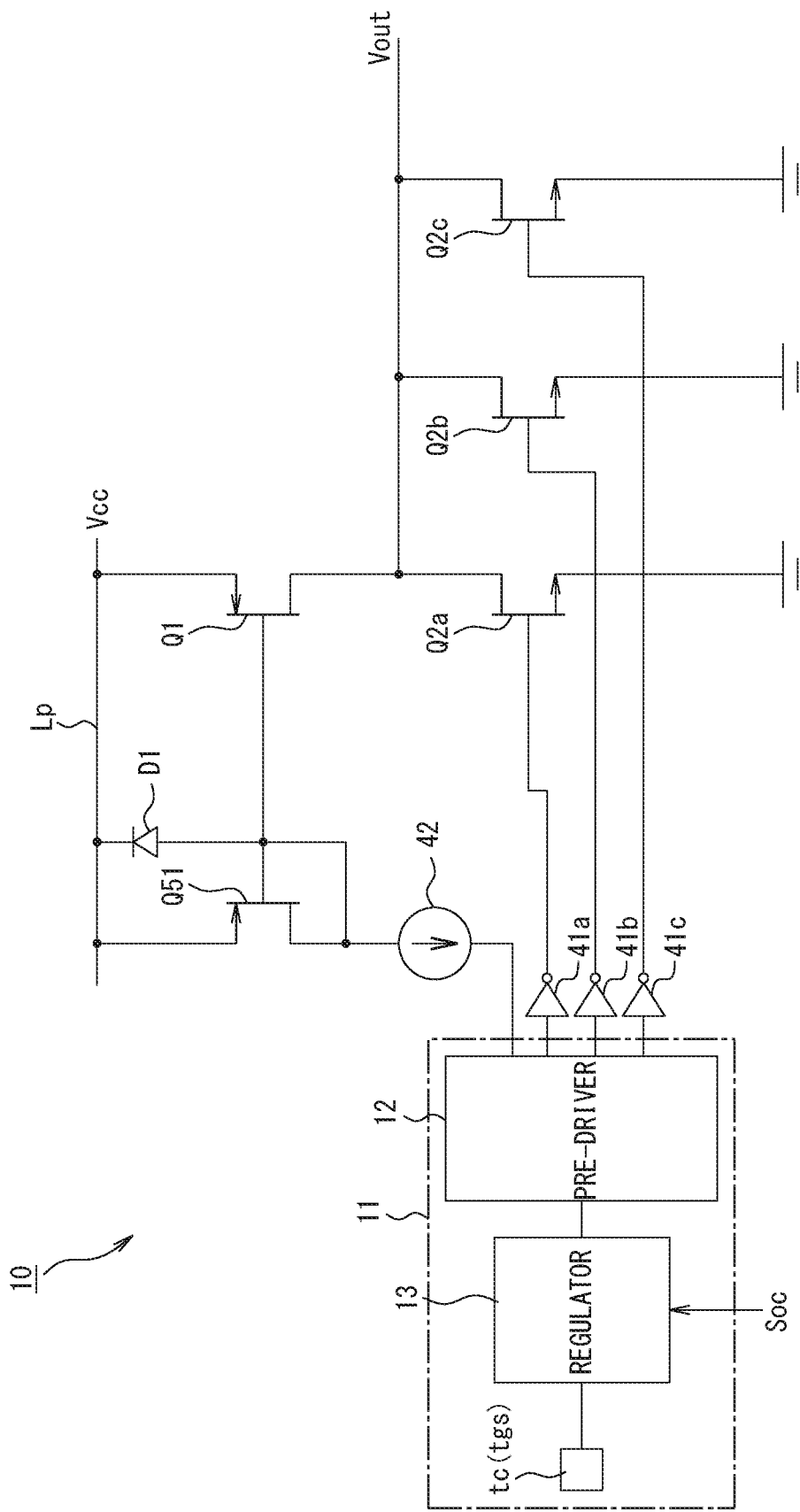
FIG. 4 is a block diagram illustrating a semiconductor integrated device according to a second embodiment of the invention.

Specifically, in the second embodiment, a source of one p-channel MOSFET Q1 is connected to the DC power supply wire Lp, and a plurality of, for example, three n-channel MOSFETs Q2a, Q2b, and Q2c are connected in parallel between a drain of the p-channel MOSFET Q1 and the ground wire Le, as illustrated in FIG. 4.

Then, gates of the respective n-channel MOSFETs Q2a, Q2b, and Q2c are connected in parallel to the pre-driver 12 via inverters 41a, 41b, and 41c.

It should be noted that a gate of the p-channel MOSFET Q1 is connected to a gate of a p-channel MOSFET Q51 that is connected in series with a constant current circuit 42 between the DC power supply wire Lp and the pre-driver 12. Then, the gates of both p-channel MOSFETs Q1 and Q51 are connected to a connection point between the p-channel MOSFET Q51 and the constant current circuit 42, and also are connected to the DC power supply wire Lp via a diode D1.

The other structures are the same as those of the first embodiment described above. Parts corresponding to those of FIG. 1 are denoted by the same reference signs, and detailed description thereof will be omitted.

According to the second embodiment, the gates of the n-channel MOSFETs Q2a to Q2c connected in parallel to the p-channel MOSFET Q1 are respectively connected in parallel to the pre-driver 12 via the inverters 41a to 41c. Thus, the gate drive voltage Vg from the regulator 13 is supplied in parallel to the respective n-channel MOSFETs Q2a to Q2c via the pre-driver 12.

Accordingly, similarly to the first embodiment described above, when performing a gate screening test in a wafer test at a stage of completion of manufacturing of the semiconductor integrated device 10, a high level operation switching signal Soc is input to the operation switching terminal toc of the regulator 13 to cause the regulator 13 to go into an operation stop state. In this state, the capacitance connection terminal tc is used as the gate screening terminal tgs, to which the gate screening voltage Vgs is applied. Simultaneously with this, by selecting a gate drive signal that is to be supplied to the pre-driver 12, the gate screening voltage Vgs that is higher than the ordinary gate drive voltage Vg can be individually applied to the gates of the respective n-channel MOSFETs Q2a to Q2c. Thus, a gate screening test can be performed individually for the plurality of n-channel MOSFETs Q2a to Q2c.

Moreover, the second embodiment similarly requires neither addition of any gate screening terminals for the plurality of n-channel MOSFETs Q2a to Q2c nor individual provision of reverse current prevention diodes for the plurality of n-channel MOSFETs Q2a to Q2c.

It should be noted that while the first and second embodiments have described the cases of applying the power MOSFETs Q1 and Q2 as voltage controlled semiconductor elements, the invention is not limited thereto, and insulated gate bipolar transistors or elements made of a wide gap semiconductor such as SiC can be applied.

In addition, while the first and second embodiments have described the cases of including the p-channel MOSFET in the targets to be driven by the gate drive circuit 11, the invention is not limited thereto. When the target(s) to be driven is/are only n-channel MOSFET (s), it is unnecessary to add any gate screening terminal.

Furthermore, while the first and second embodiments have described the cases of causing the p-channel MOSFET Q1 and the n-channel MOSFET(s) Q2 to be driven by the single pre-driver 12, the invention is not limited thereto. The p-channel MOSFET Q1 and the n-channel MOSFET(s) Q2 may be driven by individual pre-drivers. In this case, the gate drive voltage Vg may be supplied to the respective pre-drivers from a regulator common thereto.

Additionally, while the first and second embodiments have described the cases of applying the n-channel MOSFET Q31 as the switching element for inputting the operation switching signal Soc from the operation switching terminal toc, the invention is not limited thereto. An optional polarity switching element, such as a bipolar transistor or another type of FET, can be applied.

REFERENCE SIGNS LIST

10 Semiconductor integrated device
11 Gate drive circuit
12 Pre-driver
13 Regulator
21 Differential stage
22 Phase compensation circuit
23 Constant current circuit
24 Adjustment circuit
tref Input terminal
tout Output terminal
toc Operation switching terminal
tc Capacitance connection terminal
tgs, tgsp Gate screening terminal
Q1 P-channel MOSFET
Q2, Q2a to Q2c N-channel MOSFET
Q11, Q12 P-channel MOSFET
Q21, Q22, Q31, Q41 N-channel MOSFET

The invention claimed is:

1. A semiconductor integrated device, comprising:
a gate drive unit configured to drive a gate of a voltage controlled semiconductor element; and
a regulator configured to supply a gate drive voltage to the gate drive unit, the regulator including:
an output terminal to supply the gate drive voltage to the gate drive unit, the output terminal being connected to a connection point of the regulator by which an output voltage is supplied to the output terminal, and
an external connection terminal to receive a gate screening voltage for the voltage controlled semiconductor element in a gate screening test, the external connection terminal being connected to the connection point to supply the output terminal with the gate screening voltage via the connection point when the gate screening test is performed.

2. The semiconductor integrated device according to claim 1, wherein
the regulator further includes an operation switching terminal to receive an operation switching signal to control to an operation state or an operation stop state, and
when the operation switching terminal receives the operation switching signal to control to the operation stop state in the gate screening test, output of the gate drive voltage is stopped.

3. The semiconductor integrated device according to claim 1, wherein the gate drive unit is formed of a pre-driver configured to drive the gate of the voltage controlled semiconductor element based on the gate drive voltage of the regulator.

4. The semiconductor integrated device according to claim 3, wherein
a gate of a voltage controlled n-channel semiconductor element and a gate of a voltage controlled p-channel semiconductor element are individually connected to an output side of the pre-driver, and
a gate screening terminal is connected between the pre-driver and the gate of the voltage controlled p-channel semiconductor element.

5. The semiconductor integrated device according to claim 1, wherein gates of a plurality of voltage controlled n-channel semiconductor elements are connected in parallel to the gate drive unit.

6. The semiconductor integrated device according to claim 2, wherein the gate drive unit is formed of a pre-driver configured to drive the gate of the voltage controlled semiconductor element based on the gate drive voltage of the regulator.

7. The semiconductor integrated device according to claim 6, wherein
a gate of a voltage controlled n-channel semiconductor element and a gate of a voltage controlled p-channel semiconductor element are individually connected to an output side of the pre-driver, and
a gate screening terminal is connected between the pre-driver and the gate of the voltage controlled p-channel semiconductor element.

8. The semiconductor integrated device according to claim 2, wherein gates of a plurality of voltage controlled n-channel semiconductor elements are connected in parallel to the gate drive unit.

9. The semiconductor integrated device according to claim 3, wherein gates of a plurality of voltage controlled n-channel semiconductor elements are connected in parallel to the gate drive unit.

10. The semiconductor integrated device according to claim 4, wherein gates of a plurality of voltage controlled n-channel semiconductor elements are connected in parallel to the gate drive unit.

11. The semiconductor integrated device according to claim 6, wherein gates of a plurality of voltage controlled n-channel semiconductor elements are connected in parallel to the gate drive unit.

12. The semiconductor integrated device according to claim 7, wherein gates of a plurality of voltage controlled n-channel semiconductor elements are connected in parallel to the gate drive unit.

13. The semiconductor integrated device according to claim 2, wherein
the regulator further includes:
a differential stage to receive a reference voltage, an output voltage of the differential stage being supplied to the output terminal via a phase compensation circuit, and
a switching element connected between another connection point between an output side of the differential stage and the phase compensation circuit and a ground,
the operation switching terminal is connected to a control terminal of the switching element, and
the external connection terminal is connected between the phase compensation circuit and the output terminal.

14. A semiconductor integrated device, comprising:
a gate drive unit configured to drive a gate of a voltage controlled semiconductor element; and
a regulator configured to supply a gate drive voltage to the gate drive unit, the regulator including:
a differential stage to receive a reference voltage,
an output terminal to which an output voltage of the differential stage is supplied via a phase compensation circuit,
a switching element connected between a connection point between an output side of the differential stage and the phase compensation circuit and a ground,
an operation switching terminal to receive an operation switching signal to control to an operation state or an operation stop state, the operation switching terminal being connected to a control terminal of the switching element, and
an external connection terminal capable of receiving a gate screening voltage for the voltage controlled semiconductor element in a gate screening test, the external connection terminal being connected between the phase compensation circuit and the output terminal.

15. The semiconductor integrated device according to claim 14, wherein the gate drive unit is formed of a pre-driver configured to drive the gate of the voltage controlled semiconductor element based on the gate drive voltage of the regulator.

16. The semiconductor integrated device according to claim 15, wherein a gate of a voltage controlled n-channel semiconductor element and a gate of a voltage controlled p-channel semiconductor element are individually connected to an output side of the pre-driver, and
a gate screening terminal is connected between the pre-driver and the gate of the voltage controlled p-channel semiconductor element.

17. The semiconductor integrated device according to claim 14, wherein gates of a plurality of voltage controlled n-channel semiconductor elements are connected in parallel to the gate drive unit.

18. The semiconductor integrated device according to claim 15, wherein gates of a plurality of voltage controlled n-channel semiconductor elements are connected in parallel to the gate drive unit.

19. The semiconductor integrated device according to claim 16, wherein gates of a plurality of voltage controlled n-channel semiconductor elements are connected in parallel to the gate drive unit.

20. A gate screening test method of a semiconductor integrated device including a gate drive unit configured to drive a gate of a voltage controlled semiconductor element and a regulator having an output terminal configured to supply a gate drive voltage to the gate drive unit, the method comprising:

applying a switching signal to the regulator to cause the regulator to control the regulator to be in an operation stop state; and while the regulator is in the operation stop state, applying a gate screening voltage for the voltage controlled semiconductor element to an external connection terminal of the regulator to perform a gate screening test, the external connection terminal being connected to a connection point of the regulator to which the output terminal is also connected, the output terminal being supplied with the gate screening voltage from the external connection terminal via the connection point; and supplying, by the output terminal, the gate screening voltage to the gate drive unit.

* * * * *